United States Patent
Yu et al.

(10) Patent No.: US 12,364,000 B1
(45) Date of Patent: Jul. 15, 2025

(54) DEVICE STRUCTURES FOR A HIGH-VOLTAGE SEMICONDUCTOR DEVICE

(71) Applicant: GlobalFoundries U.S. Inc., Malta, NY (US)

(72) Inventors: Hong Yu, Clifton Park, NY (US); David Pritchard, Glenville, NY (US); Zhenyu Hu, Clifton Park, NY (US); Navneet Jain, Milpitas, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/823,808

(22) Filed: Sep. 4, 2024

(51) Int. Cl.
    *H10D 84/85*    (2025.01)
    *H10D 64/01*    (2025.01)
    *H10D 64/66*    (2025.01)
    *H10D 64/68*    (2025.01)

(52) U.S. Cl.
    CPC ........... *H10D 84/85* (2025.01); *H10D 64/015* (2025.01); *H10D 64/665* (2025.01); *H10D 64/683* (2025.01)

(58) Field of Classification Search
    CPC .. H01L 27/092; H01L 29/495; H01L 29/6653
    See application file for complete search history.

(56) References Cited

U.S. PATENT DOCUMENTS

| | | |
|---|---|---|
| 8,159,040 B2 | 4/2012 | Coolbaugh et al. |
| 10,050,033 B1 * | 8/2018 | Thei ............... H01L 29/517 |
| 11,417,739 B2 | 8/2022 | Lin et al. |
| 2017/0301776 A1 * | 10/2017 | Zhang ............ H01L 29/7827 |
| 2018/0175029 A1 * | 6/2018 | Ching ........... H01L 21/823821 |
| 2024/0021614 A1 | 1/2024 | Chuang et al. |

OTHER PUBLICATIONS

Hu, Zhenyu et al., "High-Voltage Semiconductor Device Structures" filed Jun. 28, 2024, as a U.S. Appl. No. 18/758,069.

* cited by examiner

*Primary Examiner* — Mohammad M Choudhry
(74) *Attorney, Agent, or Firm* — Thompson Hine LLP; Francois Pagette

(57) ABSTRACT

Device structures for a high-voltage semiconductor device and methods of forming such device structures. The structure comprises a layer stack including a first dielectric layer and a second dielectric layer. The first dielectric layer includes a portion between the second dielectric layer and a semiconductor substrate. The structure further comprises a field-effect transistor including a first source/drain region in the semiconductor substrate, a second source/drain region in the semiconductor substrate, and a gate electrode on the layer stack. The gate electrode is laterally between the first and second source/drain regions, and the gate electrode overlaps with the portion of the first dielectric layer and the second dielectric layer. The structure further comprises a spacer laterally between the first source/drain region and the second dielectric layer.

19 Claims, 8 Drawing Sheets

DEVICE STRUCTURES FOR A HIGH-VOLTAGE SEMICONDUCTOR DEVICE

BACKGROUND

The disclosure relates to semiconductor device fabrication and integrated circuits and, more specifically, to device structures for a high-voltage semiconductor device and methods of forming such device structures.

Complementary-metal-oxide-semiconductor processes may be used to build a combination of p-type and n-type field-effect transistors that are used to construct, for example, logic cells. Field-effect transistors generally include a semiconductor body supplying a channel region in a substrate, a source, a drain, and a gate structure over the channel region. When a control voltage exceeding a characteristic threshold voltage is applied to a gate electrode of the gate structure, carrier flow occurs in the channel region between the source and drain to produce a device output current.

A fin-type field-effect transistor is a non-planar device structure that may be more densely packed in an integrated circuit than a planar field-effect transistor. A fin-type field-effect transistor may include a fin providing a semiconductor body, a gate structure that overlaps with a portion of the fin, and heavily-doped source/drain regions arranged on opposite sides of the gate structure. The source/drain regions may be epitaxially grown in cavities that are etched in the fin.

Planar field-effect transistors may be configured to operate at a high voltage, such as a voltage within a range of 20 volts to 25 volts. High-voltage planar field-effect transistors cannot be integrated into a process flow forming fin-type field-effect transistors without impacting the formation of the fin-type field-effect transistors.

Improved device structures for a high-voltage semiconductor device and methods of forming such device structures are needed.

SUMMARY

In an embodiment of the invention, a structure comprises a layer stack including a first dielectric layer and a second dielectric layer. The first dielectric layer includes a portion between the second dielectric layer and a semiconductor substrate. The structure further comprises a field-effect transistor including a first source/drain region in the semiconductor substrate, a second source/drain region in the semiconductor substrate, and a gate electrode on the layer stack. The gate electrode is laterally between the first source/drain region and the second source/drain region, and the gate electrode overlaps with the portion of the first dielectric layer and the second dielectric layer. The structure further comprises a spacer laterally between the first source/drain region and the second dielectric layer.

In an embodiment of the invention, a method comprises forming a layer stack including a first dielectric layer and a second dielectric layer. The first dielectric layer is positioned between the second dielectric layer and a semiconductor substrate. The method further comprises forming a field-effect transistor including a first source/drain region in the semiconductor substrate, a second source/drain region in the semiconductor substrate, and a gate electrode on the layer stack. The gate electrode is laterally between the first source/drain region and the second source/drain region, the gate electrode overlaps with the first dielectric layer and the second dielectric layer, and a spacer is positioned laterally between the first source/drain region and the second dielectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
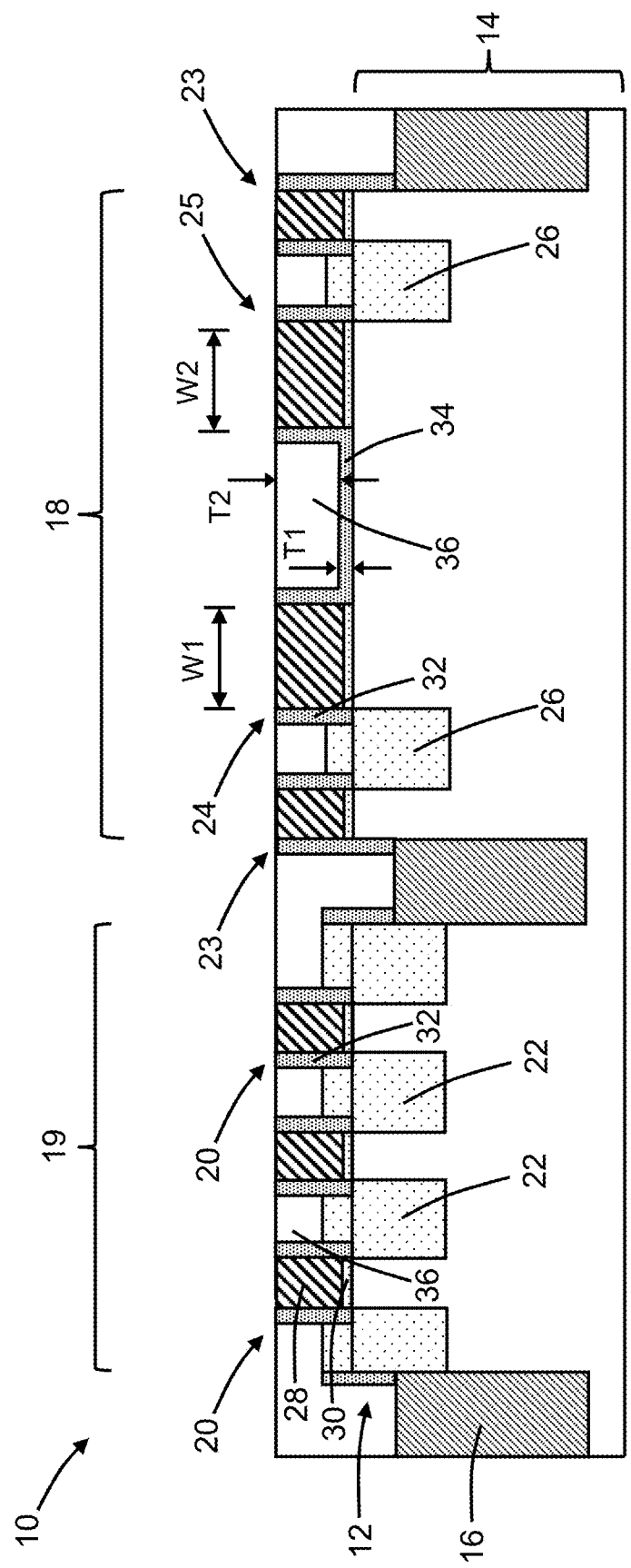
FIG. 1 is a cross-sectional view of a structure at an initial fabrication stage of a processing method in accordance with embodiments of the invention.

With reference to FIG. 1 and in accordance with embodiments of the invention, a structure 10 includes a fin 12 and a semiconductor substrate 14. The fin 12 and the semiconductor substrate 14 may be comprised of a single-crystal semiconductor material, such as single-crystal silicon. The semiconductor material of the semiconductor substrate 14 may be lightly doped with a concentration of a p-type dopant (e.g., boron). The fin 12 may be patterned from the semiconductor material of the semiconductor substrate 14 using lithography and etching processes. The fin 12 may be arranged in a device region 19 of the semiconductor substrate 14.

Shallow trench isolation regions 16 may be formed by patterning shallow trenches in the semiconductor substrate 14 with lithography and etching processes, depositing a dielectric material, such as silicon dioxide, in the shallow trenches, and planarizing and/or recessing the deposited dielectric material. The shallow trench isolation regions 16 fully surround a planar device region 18 of the semiconductor substrate 14 in which a high-voltage semiconductor device structure in the representative form of a field-effect transistor may be formed. The planar device region 18 lacks a fin similar to the fin 12, and the field-effect transistor formed in the planar device region 18 does not integrate a fin.

The fin 12 in the device region 19 may be used to fabricate a fin-type field-effect transistor. Gate structures 20 are formed that extend transversely across the fin 12 and source/drain regions 22 are formed that are disposed laterally between the gate structures 20. Gate structures 23, 24, 25 and source/drain regions 26 are also formed in the planar device region 18. The gate structures 20 and the gate structures 23, 24, 25 may include an upper layer 28 comprised of polysilicon and a lower layer 30 comprised of silicon dioxide. As used herein, the term "source/drain region" means a region of semiconductor material that can function as either a source or a drain of a field-effect transistor. The gate structures 20 and the gate structures 23, 24, 25 may be concurrently patterned from the same deposited layer stack.

The source/drain regions 22 may include doped regions inside the fin 12 in the device region 19 and doped semiconductor layers that are formed as raised regions atop the doped regions. The source/drain regions 26 may include doped regions inside the semiconductor substrate 14 in the planar device region 18 and doped semiconductor layers that are formed as raised regions atop the doped regions. In an embodiment, the source/drain regions 22 and source/drain regions 26 may be comprised of a semiconductor material, such as silicon or silicon-germanium, that is doped with an n-type dopant, such as phosphorus. In an embodiment, the raised regions of the source/drain regions 22 and the raised regions of the source/drain regions 26 may be concurrently formed by epitaxial growth with self-alignment provided by the gate structures 20 and the gate structures 23, 24, 25. The doped regions of the source/drain regions 26 that are inside the semiconductor substrate 14 in the planar device region 18 may be formed by an ion implantation process that is self-aligned to the gate structures 23, 24, 25.

In an alternative embodiment, the raised regions of the source/drain regions 26 may be formed on segments of fins that are disposed at the peripheral edges of the planar device region 18. Forming the source/drain regions 26 in this manner may result in the formation of higher-quality epitaxial semiconductor material.

The width W1 of the gate structure 24 and the width W2 of the gate structure 25 may be individually selected according to tune device characteristics for the field-effect transistor formed in the planar device region 18. In an embodiment, the width W1 of the gate structure 24 may be equal to the width W2 of the gate structure 25. In an embodiment, the width W1 of the gate structure 24 and the width W2 of the gate structure 25 may be unequal. In an embodiment, the width W1 and the width W2 may be greater than the width of the gate structures 20. In an embodiment, the width W1 and the width W2 may be equal to a distance which is an integer factor of a minimum gate width associated with the gate structures 20.

Sidewall spacers 32 are formed that respectively surround a sidewall of each gate structure 20 and a sidewall of each of the gate structures 23, 24, 25. The sidewall spacers 32 may be formed by depositing a conformal dielectric layer 34 comprised of a dielectric material over the device region 19 and also over the planar device region 18, and then etching the deposited conformal layer with an anisotropic etching process, such as reactive ion etching. The sidewall spacers 32 may be comprised of a dielectric material, such as silicon nitride, that is an electrical insulator.

A portion of the dielectric layer 34 in the planar device region 18 may be covered by an etch mask during the formation of the sidewall spacers 32 and may therefore not be removed by the anisotropic etching process forming the sidewall spacers 32. The portion of the dielectric layer 34 in the planar device region 18 may include a horizontal portion that extends laterally from the gate structure 24 to the gate structure 25, and vertical portions that extend vertically adjacent to the sidewall spacer 32 on the gate structure 24 and the sidewall spacer 32 on the gate structure 25. In an embodiment, the dielectric layer 34 in the planar device region 18 may have a thickness T1 of about 8 nanometers to about 12 nanometers.

A dielectric layer 36 may be formed as a fill layer that fills open spaces in both device regions 18, 19. In particular, the dielectric layer 36 includes a portion that is positioned on the horizontal portion of the dielectric layer 34 in the planar device region 18. In an embodiment, the dielectric layer 36 may be comprised of a dielectric material, such as silicon dioxide, that is an electrical insulator. The dielectric layer 36 may be deposited and planarized by chemical-mechanical polishing to remove topography. In an embodiment, the dielectric layer 36 on the horizontal portion of the dielectric layer 34 in the planar device region 18 may have a thickness T2 of about 20 nanometers to about 25 nanometers.

The horizontal portion of the dielectric layer 34 in the planar device region 18 is positioned between the portion of the dielectric layer 36 and the semiconductor substrate 14. One of the vertical portions of the dielectric layer 34 in the planar device region 18 is positioned between the portion of the dielectric layer 36 and the gate structure 24, and the other of the vertical portions of the dielectric layer 34 in the planar device region 18 is positioned between the portion of the dielectric layer 36 and the gate structure 24. The vertical portions of the dielectric layer 34 may laterally surround the dielectric layer 36, as shown for example in FIG. 4, and the vertical portions of the dielectric layer 34 are inclined at an angle, such as a right angle, relative to the horizontal portion of the dielectric layer 34. The gate structure 24 and the gate structure 25 function as spacers between which the dielectric layer 34 and the portion of the dielectric layer 36 are laterally positioned in the planar device region 18.

Figure 2:
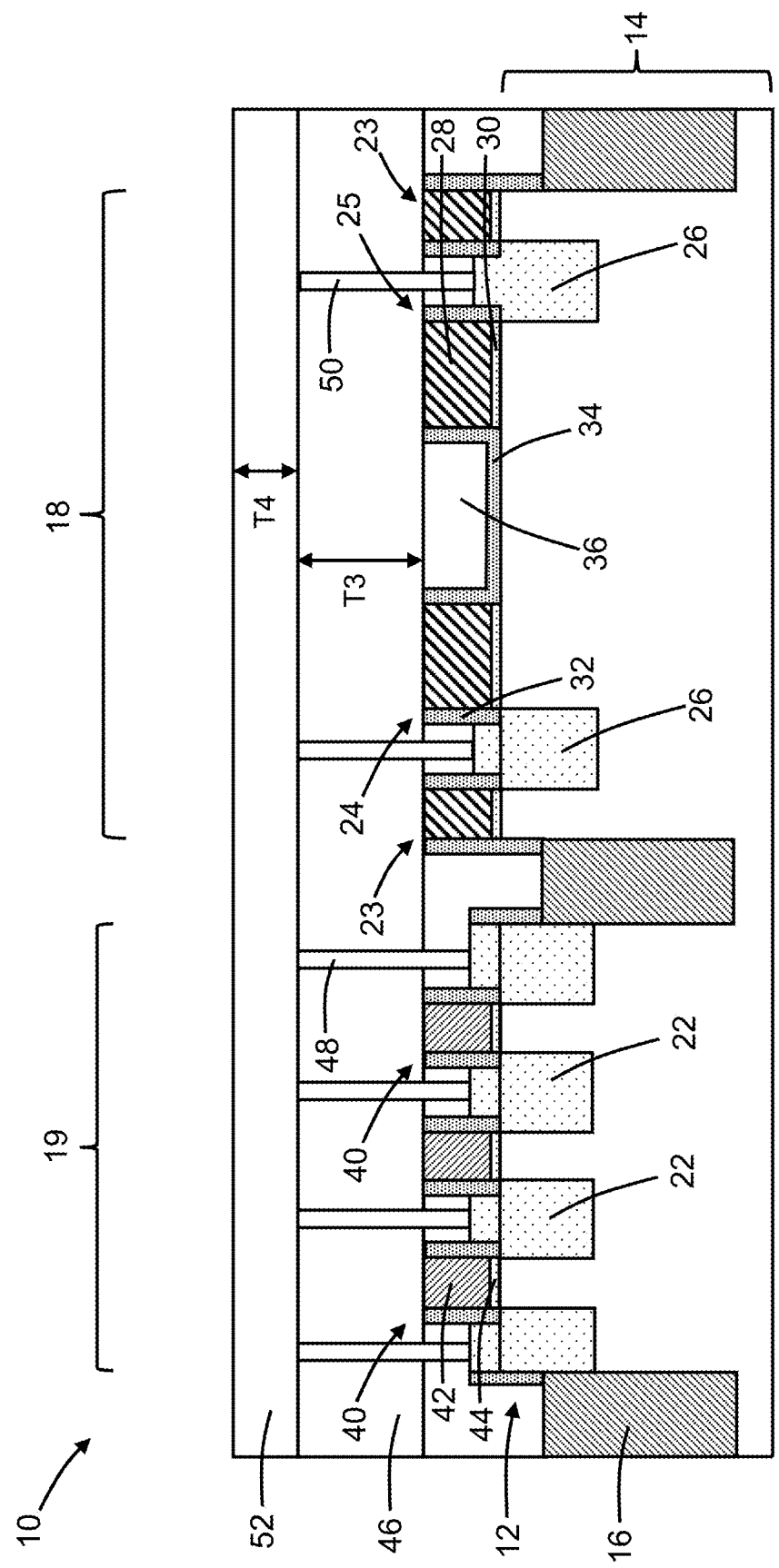
FIG. 2 is a cross-sectional view of the structure at a fabrication stage of the processing method subsequent to FIG. 1.

With reference to FIG. 2 in which like reference numerals refer to like features in FIG. 1 and at a subsequent fabrication stage of the processing method, a replacement-metal-gate process may be performed that removes the gate structures 20 and replaces the gate structures 20 with gate structures 40. The gate structures 40 may include an upper layer 42 comprised of one or more metals, such as a work function metal and tungsten, and a lower layer 44 comprised of an electrical insulator, such as a high-k dielectric material like hafnium dioxide. The gate structures 23, 24, 25 in the planar device region 18 may be covered and protected by a layer of resist during the replacement-metal-gate process.

A dielectric layer 46 may be formed that overlaps with both device regions 18, 19. In an embodiment, the dielectric layer 46 may be comprised of a dielectric material, such as silicon dioxide, that is an electrical insulator. In an embodiment, the dielectric layer 46 may have a thickness T3 of about 40 nanometers to about 50 nanometers. The dielectric layer 46 has a contacting and overlapping relationship with the gate structures 40 of the fin-type field-effect transistor in the device region 19, as well as a contacting and overlapping relationship with the gate structures 23, 24, 25 in the planar device region 18 and the portions of the dielectric layers 34, 36 laterally between the gate structure 24 and the gate structure 25.

Trench silicide contacts 48 may be formed that physically and electrically contact the source/drain regions 22 of the fin-type field-effect transistor in the device region 19. Trench silicide contacts 50 may be formed that physically and electrically contact the source/drain regions 26 of the field-effect transistor formed in the planar device region 18. The trench silicide contacts 48, 50 may contain a metal silicide, such as titanium silicide, formed by a silicidation process.

A dielectric layer 52 is formed that overlaps with the dielectric layer 46. In an embodiment, the dielectric layer 52 may be comprised of a dielectric material that contains carbon, such as carbon-doped silicon nitride, that is an electrical insulator. The dielectric layer 52 may be deposited by, for example, chemical vapor deposition or plasma-enhanced chemical vapor deposition. In an embodiment, the dielectric layer 52 may have a thickness T4 of about 15 nanometers to about 20 nanometers. The dielectric layer 52 has a non-contacting relationship with the gate structures 40 of the fin-type field-effect transistor in the device region 19. The dielectric layer 52 has a non-contacting relationship with the gate structures 23, 24, 25 in the planar device region 18 and the portion of the dielectric layer 34 laterally between the gate structure 24 and the gate structure 25.

Figure 3:
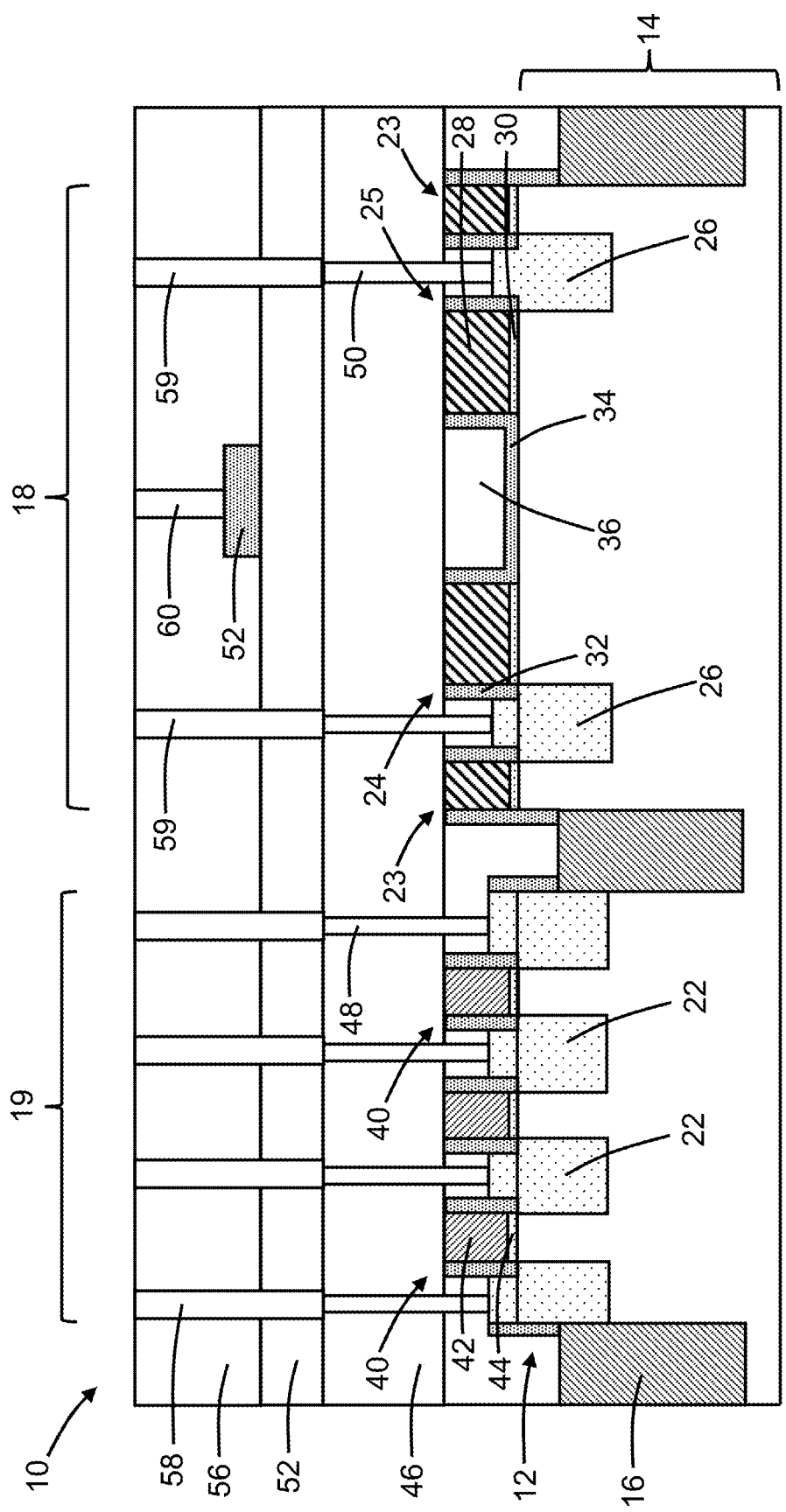
FIG. 3 is a cross-sectional view of the structure at a fabrication stage of the processing method subsequent to FIG. 2.

With reference to FIG. 3 in which like reference numerals refer to like features in FIG. 2 and at a subsequent fabrication stage of the processing method, a conductor layer 54 may be formed in the planar device region 18 on the layer stack of heterogeneous dielectric materials that includes the dielectric layer 34, the dielectric layer 36, the dielectric layer 46, and the dielectric layer 52. The conductor layer 54, which is positioned on the dielectric layer 52, may be comprised of a metal, such as tungsten silicide, that is deposited and patterned by lithography and etching processes. The patterned conductor layer 54 provides a gate electrode of the field-effect transistor formed in the planar device region 18. The gate electrode represented by the patterned conductor layer 54 is laterally disposed, in a different plane, between the source/drain regions 26. The portions of the dielectric layer 34, the dielectric layer 36, the dielectric layer 46, and the dielectric layer 52 between the conductor layer 54 and the underlying semiconductor substrate 14 collectively provide a multiple-layer gate dielectric layer of the field-effect transistor. The thickness of the gate dielectric layer is provided by the sum of the thicknesses of the dielectric layer 34, the dielectric layer 36, the dielectric layer 46, and the dielectric layer 52. The multiple-layer gate dielectric layer is vertically positioned between the gate electrode represented by the conductor layer 54 and the semiconductor substrate 14 in the planar device region 18.

A dielectric layer 56 is formed as a blanket layer over the dielectric layer 52 and the conductor layer 54. In an embodiment, the dielectric layer 56 may be comprised of a dielectric material, such as silicon dioxide. Contacts 58 are formed that are respectively physically and electrically coupled by the trench silicide contacts 48 to the source/drain regions 22. Contacts 59 are formed that are respectively physically and electrically coupled by the trench silicide contacts to the source/drain regions 26. Contacts 60 are formed that are respectively physically and electrically coupled to the patterned conductor layer 54. The contacts 58, 59, 60 may be comprised of a metal, such as tungsten, that is deposited in contact openings patterned in the dielectric layers 52, 56 and planarized by chemical-mechanical polishing.

The field-effect transistor formed in the planar device region 18 is a different type of transistor than the fin-type field-effect transistor that is formed in the device region 19. In that regard, the field-effect transistor formed in the planar device region 18 may be considered to constitute a high-voltage semiconductor device structure capable of handling higher voltages, such as voltages on the order of 20 volts to 25 volts, than the fin-type field-effect transistor formed in the device region 19. The high voltage handling capability is enabled because the multiple dielectric layers, namely the dielectric layer 34, the dielectric layer 36, the dielectric layer 46, and the dielectric layer 52, that are included as sublayers in the multiple-layer gate dielectric layer provide a thick gate dielectric layer between the gate electrode represented by the patterned conductor layer 54 and the underlying semiconductor substrate 14. The high-voltage field-effect transistor is formed in the planar device region 18 by an innovative approach that provides a thick gate dielectric layer without impacting the process flow forming the fin-type field-effect transistor in the device region 19. The ability to select the width W1 of the gate structure 24 and the width W2 of the gate structure 25 determines the lateral spacing between the conductor layer 54 and the source/drain regions 26, which permits the ability to tune device characteristics.

Figure 4:
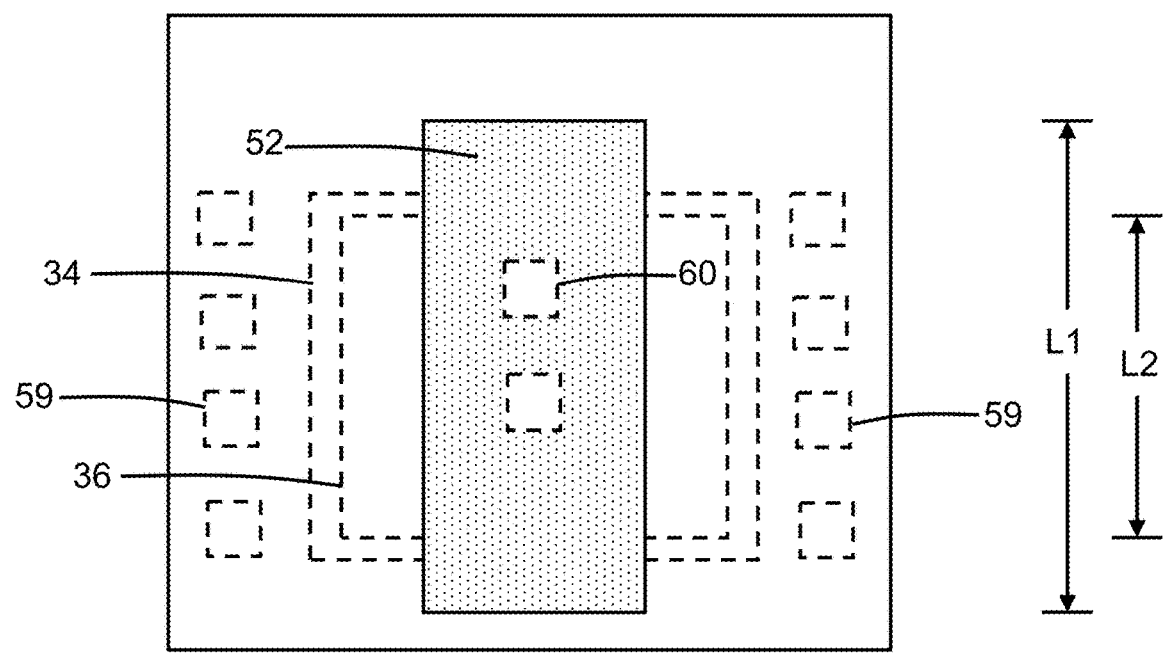
FIG. 4 is a top view of a structure in accordance with alternative embodiments of the invention.

With reference to FIG. 4 and in accordance with alternative embodiments, the length L1 of the conductor layer 54 may be greater than the length L2 of the underlying portion of the dielectric layer 36 such that the conductor layer 54 fully overlaps with the underlying portion of the dielectric layer 36 and extends outwardly beyond the side edges of the underlying portion of the dielectric layer 36. The contacts 60 may land on the conductor layer 54 inside of the active device region and over the active portion of the conductor layer 54.

Figure 5:
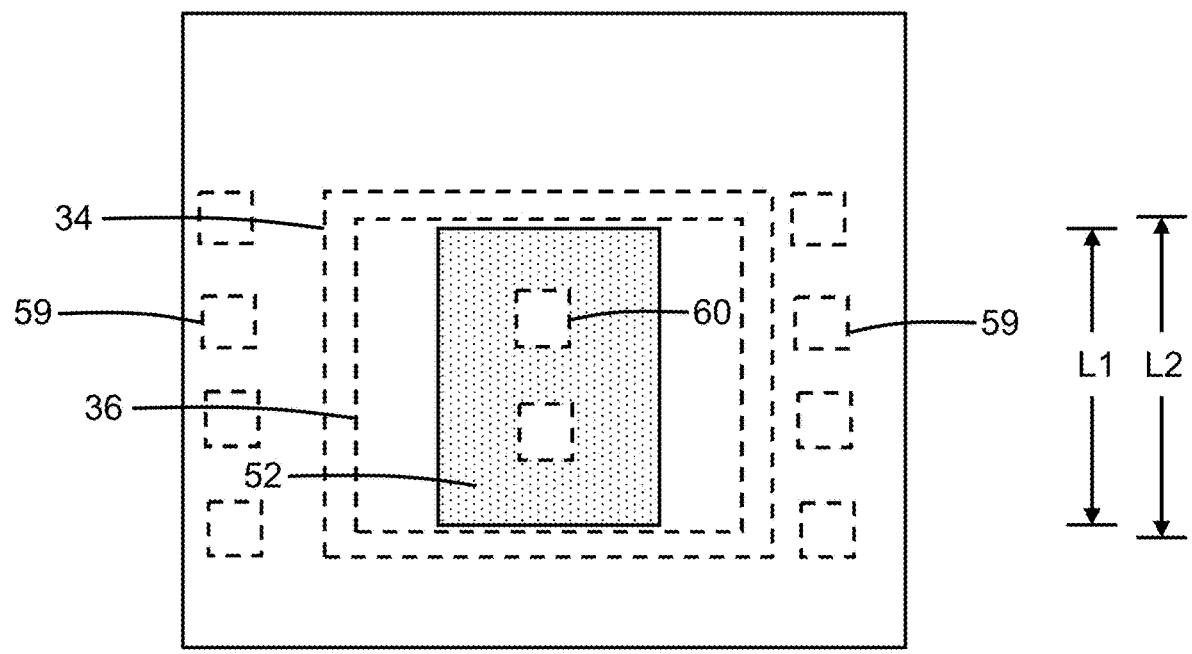
FIG. 5 is a top view of a structure in accordance with alternative embodiments of the invention.

With reference to FIG. 5 and in accordance with alternative embodiments, the length L1 of the conductor layer 54 may be less than or equal to than the length L2 of the underlying portion of the dielectric layer 36 such that the conductor layer 54 partially overlaps with the underlying portion of the dielectric layer 36. The contacts 60 may land on the conductor layer 54 inside of the active device region and over the active portion of the conductor layer 54.

Figure 6:
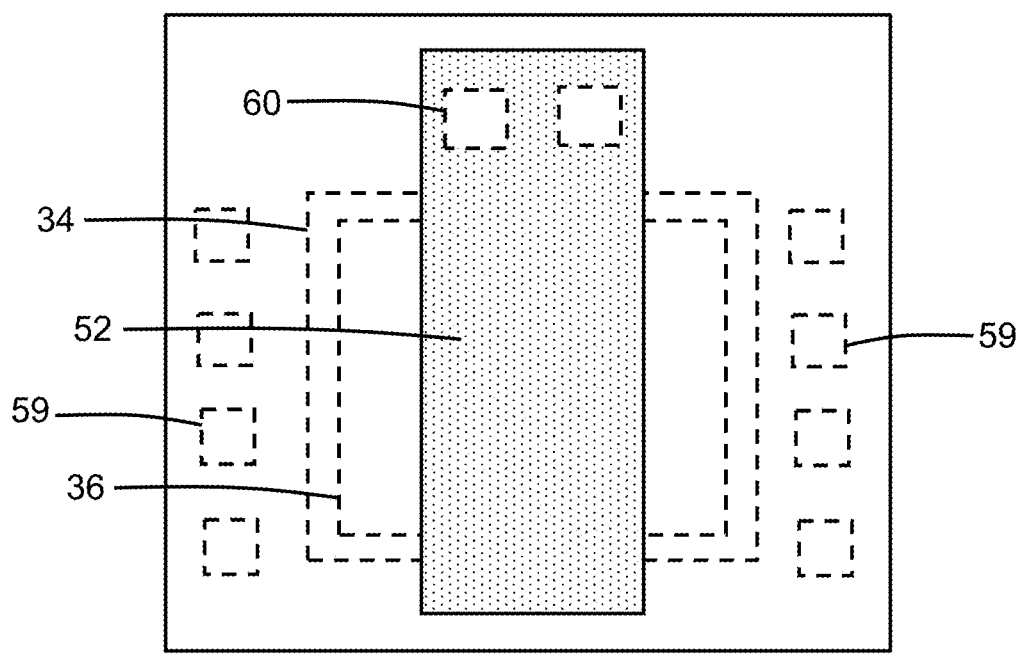
FIG. 6 is a top view of a structure in accordance with alternative embodiments of the invention.

With reference to FIG. 6 and in accordance with alternative embodiments, the length L1 of the conductor layer 54 may be longer than the length L2 of the underlying portion of the dielectric layer 36 such that the conductor layer 54 fully overlaps with the underlying portion of the dielectric layer 36 and extends outwardly beyond the side edges of the underlying portion of the dielectric layer 36. The contacts 60 may land on the conductor layer 54 outside of the active device region and offset from the active portion of the conductor layer 54.

Figure 7:
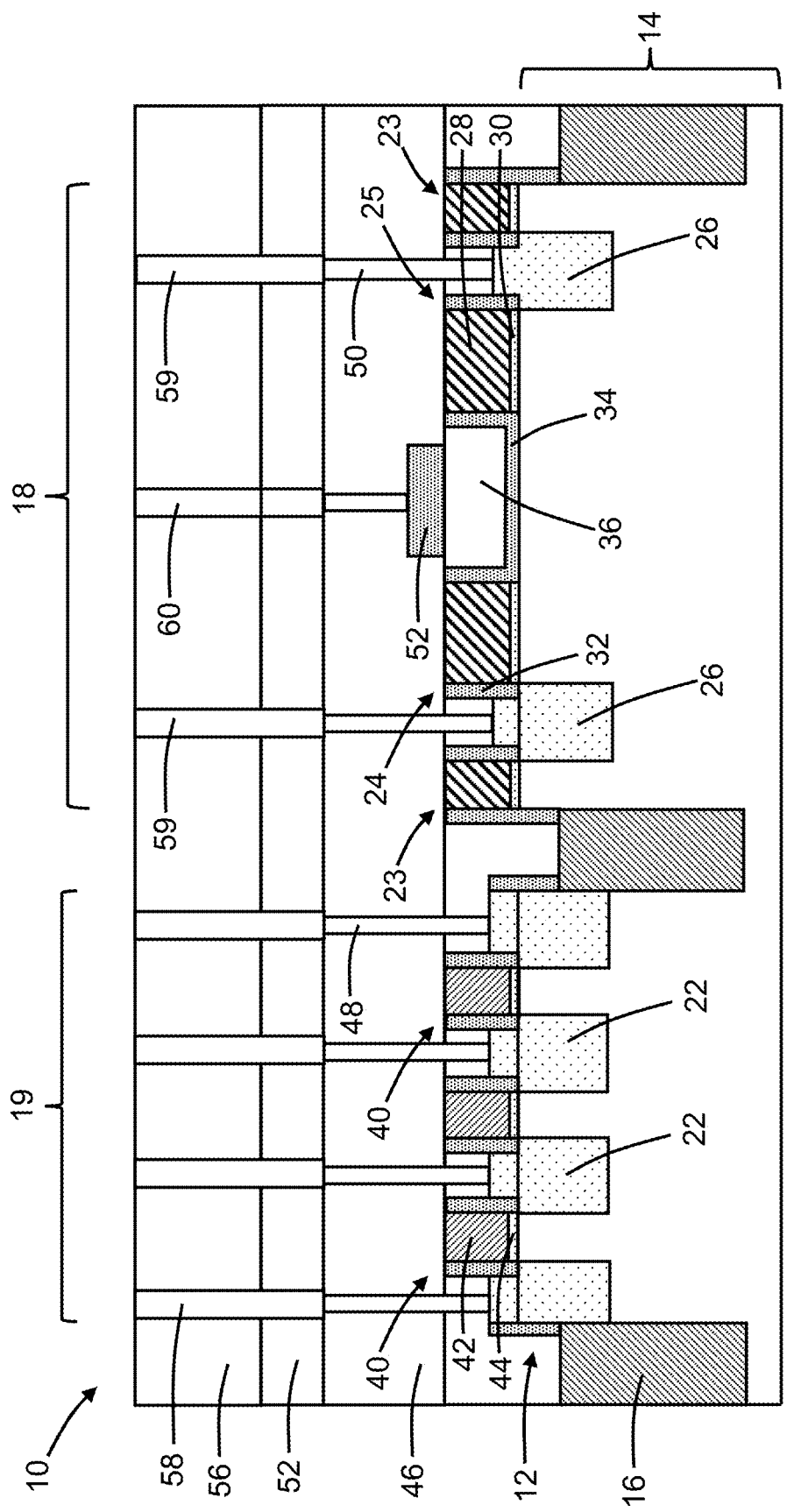
FIG. 7 is a cross-sectional view of a structure in accordance with alternative embodiments of the invention.

With reference to FIG. 7 and in accordance with alternative embodiments, the patterned conductor layer 54 representing the gate electrode of the field-effect transistor in the structure 10 may be formed on the dielectric layer 36 instead of being formed on the dielectric layer 52. In an embodiment, the patterned conductor layer 54 may be in direct contact with the dielectric layer 36. The dielectric layer 34 and the dielectric layer 36 provide sublayers of the multiple-layer gate dielectric layer for the field-effect transistor embodied in the structure 10. Consequently, the thickness of the multiple-layer gate dielectric layer for the field-effect transistor is provided by the sum of the thicknesses of the dielectric layer 34 and the dielectric layer 36 in the planar device region 18.

The field-effect transistor including the patterned conductor layer 54 is formed in the planar device region 18 of the semiconductor substrate 14 and the fin-type field-effect transistor including the fin 12 is formed in the device region 19 of the semiconductor substrate 14. The field-effect transistor in the planar device region 18 may be capable of handling higher voltages than the field-effect transistor formed in the device region 19 using the fin 12. For example, the field-effect transistor in the planar device region 18 may be considered to constitute a high-voltage semiconductor device structure capable of handling higher voltages, such as voltages on the order of 8 volts to 10 volts.

In an embodiment, the structure 10 for the field-effect transistor including the patterned conductor layer 54 on the dielectric layer 36 may be formed in the planar device region 18 of the semiconductor substrate 14, and the structure 10 for the field-effect transistor including the patterned conductor layer 54 on the dielectric layer 52, which is a different transistor type with a different voltage-handling ability, may be formed in a different planar device region of the semiconductor substrate 14. As a result, field-effect transistors of different high voltage-handling capability may be integrated on the same semiconductor substrate 14 along with the fin-type field-effect transistor.

Figure 8:
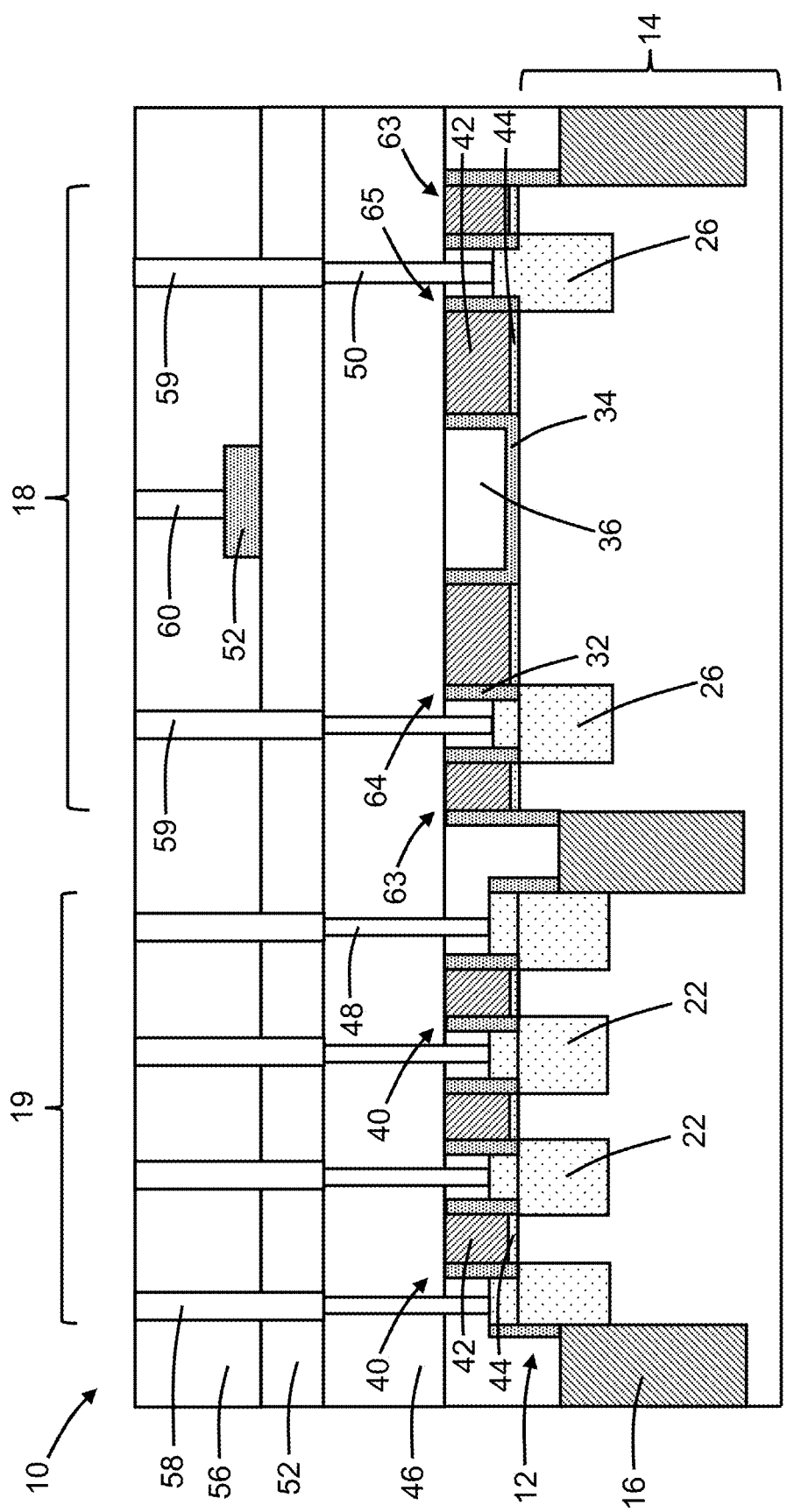
FIG. 8 is a cross-sectional view of a structure in accordance with alternative embodiments of the invention.

With reference to FIG. 8 and in accordance with alternative embodiments, the gate structures 23, 24, 25 in the planar device region 18 may be removed and replaced by gate structures 63, 64, 65 during the replacement-metal-gate process. Each of the gate structures 63, 64, 64 includes the upper layer 42 comprised of one or more metals, such as a work function metal and tungsten, and the lower layer 44 comprised of an electrical insulator, such as a high-k dielectric material like hafnium dioxide. The gate structure 64 and the gate structure 65 on opposite sides of the dielectric layers 34, 36 define spacers that replace the spacers originally represented by the gate structures 24, 25.

Figure 9:
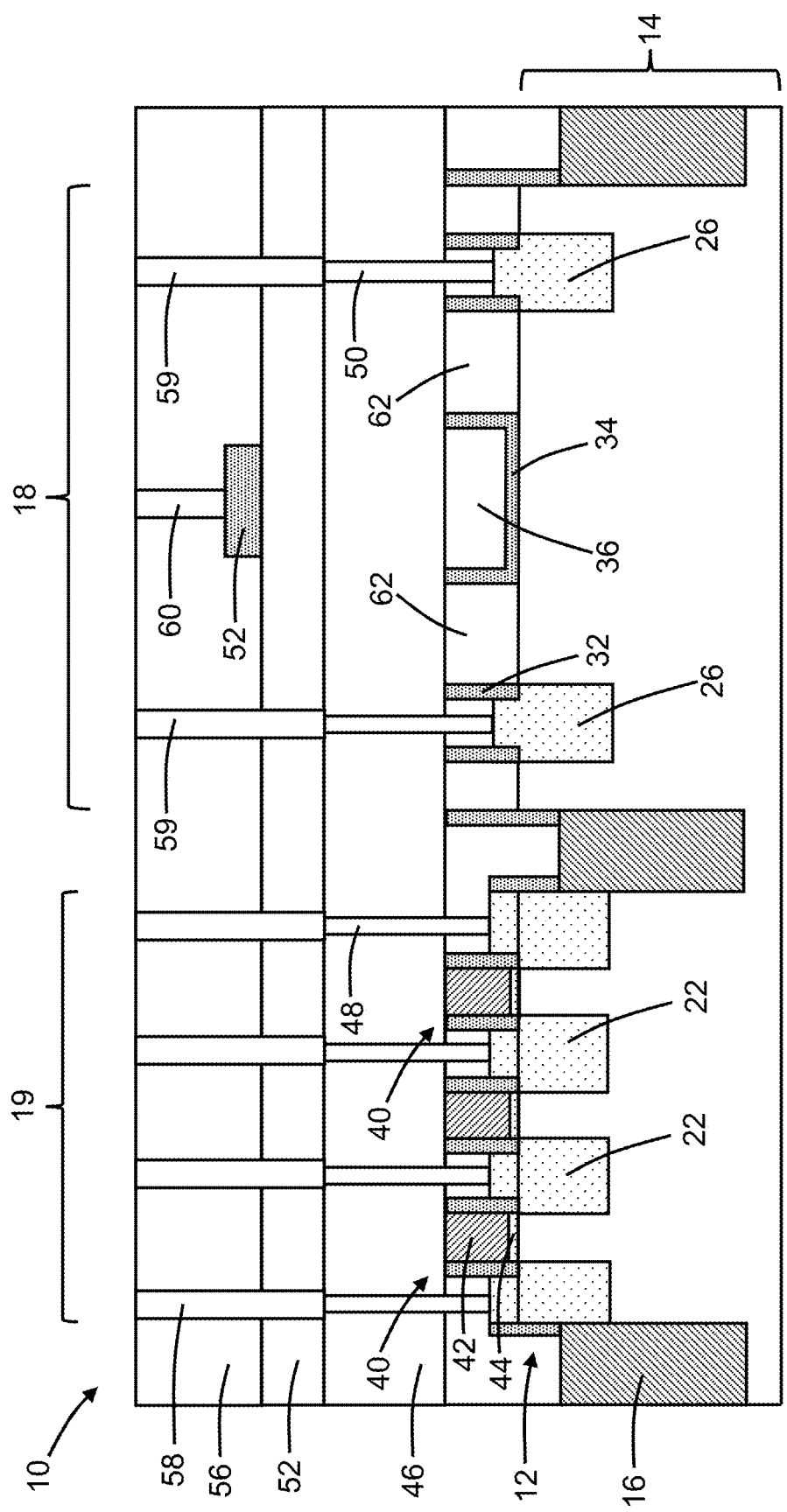
FIG. 9 is a cross-sectional view of a structure in accordance with alternative embodiments of the invention.

With reference to FIG. 9 and in accordance with alternative embodiments, the gate structures 23, 24, 25 in the planar device region 18 may be removed and a dielectric layer 62 may be deposited and planarized. In an embodiment, the dielectric layer 62 may be comprised of a dielectric material, such as silicon dioxide, that is an electrical insulator. Portions of the deposited dielectric layer 62 fill the spaces created by the removal of the gate structures 23, 24, 25, and have the same dimensions as the removed gate structures 23, 24, 25. The portions of the dielectric layer 62 on opposite sides of the dielectric layers 34, 36 define spacers that replace the spacers originally represented by the gate structures 24, 25.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor substrate;
a layer stack including a first dielectric layer, a second dielectric layer, and a third dielectric layer, the first dielectric layer comprising a first dielectric material, the second dielectric layer comprising a second dielectric material, the third dielectric layer comprising a third dielectric material, the first dielectric layer including a first portion between the second dielectric layer and the semiconductor substrate, the third dielectric layer including a first portion, and the second dielectric layer between the first portion of the first dielectric layer and the first portion of the third dielectric layer;
a first field-effect transistor including a first source/drain region in the semiconductor substrate, a second source/drain region in the semiconductor substrate, and a gate electrode on the layer stack, the gate electrode laterally between the first source/drain region and the second source/drain region, and the gate electrode overlapping with the first portion of the first dielectric layer, the second dielectric layer, and the first portion of the third dielectric layer; and
a first spacer laterally between the first source/drain region and the second dielectric layer.

2. The structure of claim 1 further comprising:
a second spacer laterally between the second source/drain region and the second dielectric layer.

3. The structure of claim 2 wherein the first dielectric layer includes a second portion laterally between the second dielectric layer and the first spacer, and the first dielectric layer includes a third portion laterally between the second dielectric layer and the second spacer.

4. The structure of claim 3 wherein the second portion of the first dielectric layer is inclined relative to the first portion of the first dielectric layer, and the third portion of the first dielectric layer is inclined relative to the first portion of the first dielectric layer.

5. The structure of claim 1 wherein the first dielectric layer includes a second portion laterally between the second dielectric layer and the first spacer.

6. The structure of claim 5 wherein the second portion of the first dielectric layer is inclined relative to the first portion of the first dielectric layer.

7. The structure of claim 1 wherein the second dielectric material differs from the first dielectric material.

8. The structure of claim 1 wherein the first spacer comprises a first layer including polysilicon and a second layer including silicon dioxide.

9. The structure of claim 1 wherein the first spacer comprises a first layer including a work function metal and a second layer including a high-k dielectric material.

10. The structure of claim 1 wherein the gate electrode comprises tungsten silicide.

11. The structure of claim 1 wherein the layer stack includes a fourth dielectric layer between the first portion of the third dielectric layer and the gate electrode, the fourth dielectric layer comprises a fourth dielectric material, and the fourth dielectric layer overlaps with the first portion of the first dielectric layer, the second dielectric layer, and the first portion of the third dielectric layer.

12. The structure of claim 1 wherein the semiconductor substrate includes a first device region and a second device region, the first field-effect transistor is positioned in the first device region, and further comprising:
 a second field-effect transistor positioned in the second device region, the second field-effect transistor including a semiconductor fin and a gate structure extending transversely over the semiconductor fin,
 wherein the third dielectric layer includes a second portion that overlaps with the second device region.

13. The structure of claim 12 wherein the second field-effect transistor is laterally spaced from the first portion of the first dielectric layer and the second dielectric layer.

14. The structure of claim 1 wherein the third dielectric layer includes a second portion, and further comprising:
 a first contact coupled to the first source/drain region, the first contact extending through the second portion of the third dielectric layer.

15. The structure of claim 14 wherein the third dielectric layer includes a third portion, the first portion of the third dielectric layer is laterally positioned between the second portion of the third dielectric layer and the third portion of the third dielectric layer, and further comprising:
 a second contact coupled to the second source/drain region, the second contact extending through the third portion of the third dielectric layer.

16. The structure of claim 15 wherein the first portion of the first dielectric layer, the second dielectric layer, and the first portion of the third dielectric layer are positioned laterally between the first contact and the second contact.

17. The structure of claim 1 wherein the first dielectric material comprises silicon nitride, and the second dielectric material comprises silicon dioxide.

18. A method comprising:
 forming a layer stack including a first dielectric layer, a second dielectric layer, and a third dielectric layer, wherein the first dielectric layer comprises a first dielectric material, the second dielectric layer comprises a second dielectric material, the third dielectric layer comprises a third dielectric material, the first dielectric layer includes a portion positioned between the second dielectric layer and a semiconductor substrate, the third dielectric layer including a portion, and the second dielectric layer positioned between the portion of the first dielectric layer and the portion of the third dielectric layer;
 forming a field-effect transistor including a first source/drain region in the semiconductor substrate, a second source/drain region in the semiconductor substrate, and a gate electrode on the layer stack, wherein the gate electrode is laterally between the first source/drain region and the second source/drain region, the gate electrode overlaps with the portion of the first dielectric layer, the second dielectric layer, and the portion of the third dielectric layer; and
 forming a first spacer positioned laterally between the first source/drain region and the second dielectric layer.

19. The method of claim 18 further comprising:
 forming a second spacer between the layer stack and the first source/drain region;
 removing the second spacer after forming the first dielectric layer and the second dielectric layer; and
 forming the first spacer as a replacement for the second spacer.

* * * * *